United States Patent
Barth, Jr. et al.

(10) Patent No.: US 8,132,131 B2
(45) Date of Patent: Mar. 6, 2012

(54) DESIGN STRUCTURE INCLUDING FAILING ADDRESS REGISTER AND COMPARE LOGIC FOR MULTI-PASS REPAIR OF MEMORY ARRAYS

(75) Inventors: John E. Barth, Jr., Williston, VT (US); Stephen F. Sliva, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 696 days.

(21) Appl. No.: 12/128,197

(22) Filed: May 28, 2008

(65) Prior Publication Data
US 2009/0158224 A1 Jun. 18, 2009

Related U.S. Application Data

(63) Continuation-in-part of application No. 11/958,697, filed on Dec. 18, 2007, now abandoned.

(51) Int. Cl.
 *G06F 17/50* (2006.01)
(52) U.S. Cl. .......................... 716/100; 716/101
(58) Field of Classification Search ........... 716/100–102
 See application file for complete search history.

(56) References Cited

U.S. PATENT DOCUMENTS

| | | | |
|---|---|---|---|
| 4,093,985 A | 6/1978 | Das | |
| 4,584,673 A | 4/1986 | Kuijk | |
| 4,819,205 A | 4/1989 | McRoberts | |
| 5,313,424 A | 5/1994 | Adams et al. | |
| 5,317,704 A | 5/1994 | Izawa et al. | |
| 5,392,292 A | 2/1995 | Davis et al. | |
| 5,617,364 A | 4/1997 | Hatakeyama | |
| 5,764,576 A | 6/1998 | Hidaka et al. | |
| 6,748,519 B1 | 6/2004 | Moore | |
| 6,862,703 B2 * | 3/2005 | Oonk | 714/718 |
| 6,937,531 B2 | 8/2005 | Frankowsky | |
| 7,219,271 B2 * | 5/2007 | Kleveland et al. | 714/718 |
| 7,571,403 B2 * | 8/2009 | Jain et al. | 716/106 |
| 2003/0204789 A1 * | 10/2003 | Peebles et al. | 714/47 |
| 2003/0204798 A1 * | 10/2003 | Adams et al. | 714/723 |

OTHER PUBLICATIONS

U.S. Appl. No. 11/958,697, "Notice of Allowance", Apr. 29, 2009, 10 pages.

* cited by examiner

*Primary Examiner* — Jack Chiang
*Assistant Examiner* — Binh Tat
(74) *Attorney, Agent, or Firm* — Michael J. LeStrange; Hoffman Warnick LLC

(57) ABSTRACT

Disclosed is design structure including an integrated circuit having a system for moving a failing address into a new FAR by utilizing the functional compare circuitry during BIST of redundant memory elements. Disclosed is an any-for-any scheme that eliminates the tri-state address bus. The design structure allows for easy, discrete scaling with the addition of more FARs, while also allowing larger addresses with no additional control circuit overhead.

18 Claims, 5 Drawing Sheets

DESIGN STRUCTURE INCLUDING FAILING ADDRESS REGISTER AND COMPARE LOGIC FOR MULTI-PASS REPAIR OF MEMORY ARRAYS

This application is a continuation-in-part application of U.S. Ser. No. 11/958,697, filed Dec. 18, 2007, now abandoned.

FIELD OF THE INVENTION

This disclosure relates generally to the implementation of failing address registers (FARs) in a memory array, and more particularly to a design structure including an integrated circuit having FARs whose corresponding redundant elements fail during test and repair of the memory array.

BACKGROUND OF THE INVENTION

Many memory array redundancy schemes employ several failing address registers (FARs) that correspond 1-to-1 with redundant memory elements. If during a built-in self-test (BIST) mode, a memory element (e.g., row, column, etc.) fails, its address is stored in a FAR. After built-in self-test (BIST) is completed, the contents of the FARs are stored in a nonvolatile memory or bank of fuses. When the memory is being used during a functional mode, compare circuitry is used to match the read or write address with the addresses in the FARs. If the functional address matches a FAR, the read or write is mapped to the redundant memory element.

However, if during the BIST of the redundant memory elements, a redundant memory element is determined to fail, then accommodations must be made to ensure that the corresponding FAR is not utilized. In particular, when a redundant element fails, the failing address stored in the corresponding FAR must be stored in the next available FAR. Since the stored failing address may have been retained in any of numerous previous test passes, the BIST cannot be relied on to re-detect the fail of the same stored failing address.

To move the failing address to the next available FAR, current approaches employ a tri-state address bus among the FAR registers to allow the shifting of any failing address to the next available FAR. This any-for-any address shift addresses two issues that occur in a simple address shift to the next FAR. (1) In a chained shift-to-next scheme, if the next FAR or any subsequent FAR has been marked as failing, a failing address will have to shift two or more FARs. (2) Shifting all failing addresses located in subsequent FARs results in a substantial change in the nonvolatile storage of the FARs. If the nonvolatile storage is write-only—as with fuses—the shift results in many more fuses being used.

Unfortunately, the tri-state address bus approach requires substantial circuit overhead for each FAR and careful circuit tuning for arrays containing large numbers of FARs. Not only does the bus overhead grow with the number of FARs, but it also grows with the address size. Accordingly, a need exists for a system and method for moving the failing address into the next available FAR with minimal additional circuitry.

SUMMARY OF THE INVENTION

Disclosed is design structure including an integrated circuit having a system for moving a failing address into a new FAR by utilizing the functional compare circuitry during BIST of redundant memory elements. Disclosed is an any-for-any scheme that eliminates the tri-state address bus. The design structure allows for easy, discrete scaling with the addition of more FARs, while also allowing larger addresses with no additional control circuit overhead.

In one embodiment, there is a method of reallocating an address in a failing address register (FAR) of an integrated circuit when a corresponding redundant element fails, comprising: providing a set of FARs and an associated set of redundant elements, wherein each FAR maps to a corresponding redundant element; testing a set of elements and placing an address of each failing element into a FAR; testing each redundant element and marking a FAR as bad when a redundant element corresponding to the FAR fails; and readdressing the set of elements and placing an address of an element being readdressed in a new FAR when the address of the element being re-addressed matches an address in a FAR that has been marked as bad.

In a second embodiment, there is an integrated circuit having a system for reallocating an address in a failing address register (FAR) when a corresponding redundant element fails, comprising: a set of FARs and an associated set of redundant elements, wherein each FAR maps to a corresponding redundant element; control logic for testing a set of elements and placing an address of each failing element into a FAR; control logic for testing each redundant element and marking a FAR as bad when a redundant element corresponding to the FAR fails; and control logic for readdressing the set of elements and placing an address of an element being readdressed into a new FAR when the address of the element being readdressed matches an address in a FAR that has been marked as bad.

In a third embodiment, there is a integrated circuit, comprising: a built in self test (BIST) system for testing elements and redundant elements during a BIST mode; a set of failing address registers (FARs) for storing addresses of failing elements discovered during BIST mode, wherein each FAR maps to a corresponding redundant element; an address bus; compare circuitry for comparing addresses placed on the address bus during a functional mode with addresses stored in the set of FARs; and control logic that utilizes the compare circuitry during BIST mode to compare an address on the address bus during a readdress phase with each FAR that has been marked as bad.

In a fourth embodiment, there is a design structure embodied in a machine readable medium for designing, manufacturing, or testing an integrated circuit, the design structure comprising: an integrated circuit having a system for reallocating an address in a failing address register (FAR) when a corresponding redundant element fails, comprising: a set of FARs and an associated set of redundant elements, wherein each FAR maps to a corresponding redundant element; control logic for testing a set of elements and placing an address of each failing element into a FAR; control logic for testing each redundant element and marking a FAR as bad when a redundant element corresponding to the FAR fails; and control logic for readdressing the set of elements and placing an address of an element being readdressed into a new FAR when the address of the element being readdressed matches an address in a FAR that has been marked as bad.

In a fifth embodiment, there is a design structure embodied in a machine readable medium for designing, manufacturing, or testing an integrated circuit, the design structure comprising: an integrated circuit, comprising: a built in self test (BIST) system for testing elements and redundant elements during a BIST mode; a set of failing address registers (FARs) for storing addresses of failing elements discovered during BIST mode, wherein each FAR maps to a corresponding redundant element; an address bus; compare circuitry for comparing addresses placed on the address bus during a functional mode with addresses stored in the set of FARs; and control logic that utilizes the compare circuitry during BIST mode to compare an address on the address bus during a readdress phase with each FAR that has been marked as bad.

The illustrative aspects of the present invention are designed to solve the problems herein described and other problems not discussed.

BRIEF DESCRIPTION OF THE DRAWINGS

These and other features of this invention will be more readily understood from the following detailed description of the various aspects of the invention taken in conjunction with the accompanying drawings.

Figure 1:
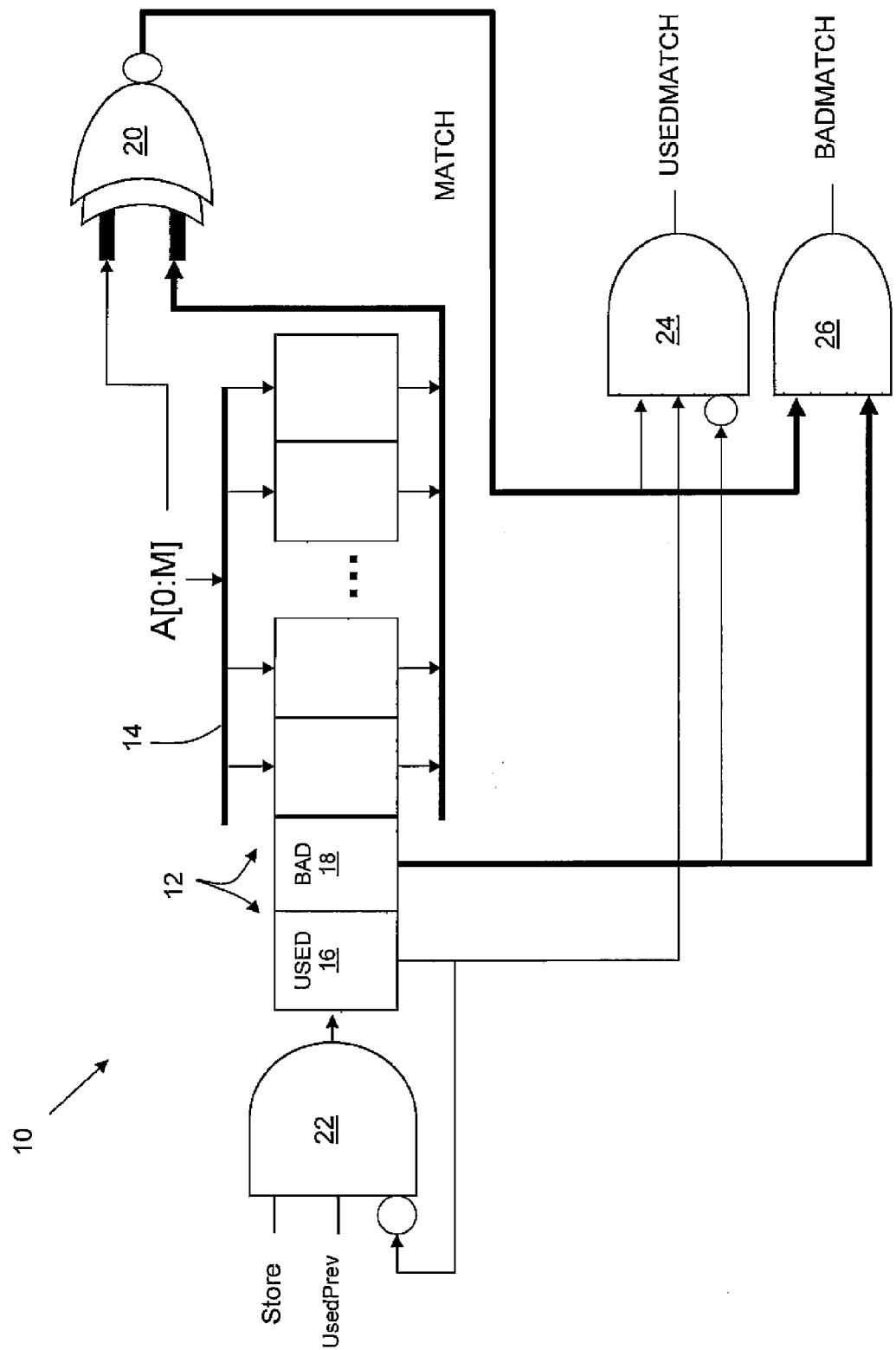
FIG. 1 depicts an integrated circuit including a system for reallocating FARs in accordance with an embodiment of the present disclosure.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

FIG. 1 depicts a schematic of an integrated circuit 10 comprising a failing address register (FAR) and the associated logic for moving a failing address into a next available (FAR) by utilizing existing functional compare circuitry 20 during built in self test (BIST) of redundant memory elements. As noted above, when a bad memory element is identified during BIST, the address can be stored in a FAR, which has a one-to-one correspondence with a redundant memory element. Thus, in operation, the redundant memory element will be used in place of the bad memory element. However, BIST must also test the redundant memory elements to ensure that they do not fail. If a failing redundant memory element is found, then the failing address stored in the FAR corresponding to the failing redundant memory element must be moved to a new FAR.

Figure 4:
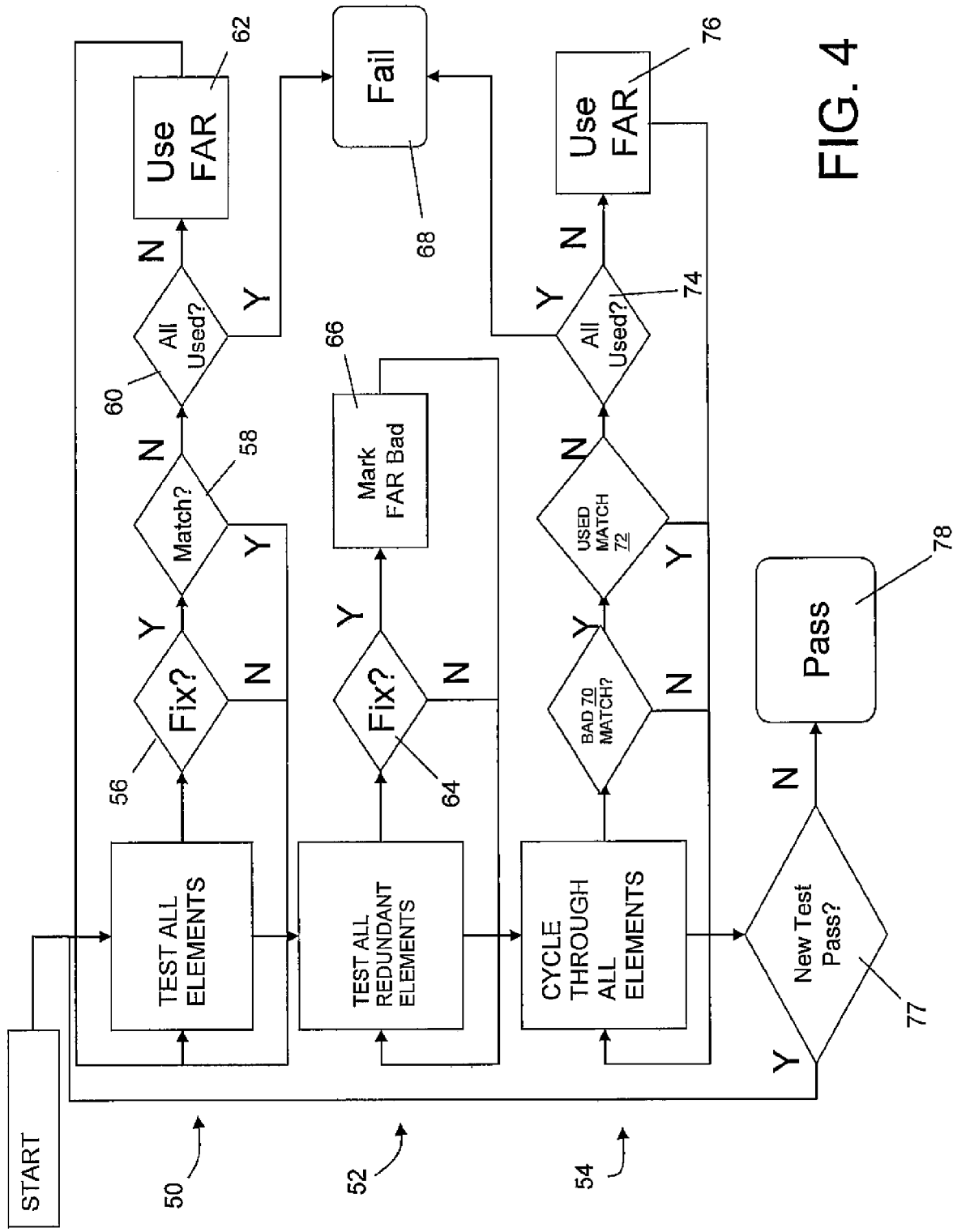
FIG. 4 depicts a flow diagram for implementing the FAR circuit of FIG. 1 in accordance with an embodiment of the present disclosure.

The process of moving failing addresses is implemented using a three phase approach, which is outlined in FIG. 4. In the first phase 50 of the test pass, BIST is utilized to test all the memory elements, and if a bad element is found, its address is loaded into a FAR. As shown in FIG. 4, the process includes determining if an element should be fixed 56, and if so, whether the address of the failing element is one that matches an already stored address 58, i.e., it has already been fixed. If the address matches an already stored address, a next element is tested. If a fix is required and no match occurs, then a determination is made whether there is an available FAR 60 to implement a fix. If not all the FARs have been used, a new FAR is used 62 to store the address of the failing element. Otherwise a fail condition 68 occurs.

In the second phase 52 of the test pass, each redundant element is tested to determine if a fix is required 64. If it is determined that there is a failing redundant element, the corresponding FAR is marked as bad 66. Note that during this phase, no attempt is made to move the failing address from a "bad" FAR to a new FAR. Instead, each FAR corresponding to failing redundant element is simply marked as bad.

In the third phase 54 of the test pass, the addresses for all of the memory elements are cycled, i.e., "readdressed" by reissuing each address back onto the address bus. Note that no actual testing of the elements is required and the readdressing can coincide with any memory command including a read instruction, a write instruction, a NOOP instruction, etc. Compare circuitry is used to compare addresses on the address bus with those stored in FARs. If there is a BADMATCH 70 and there is a USEDMATCH 72, then a determination is made whether all FARS have already been used 74. If not, then the matching address in the bad FAR is loaded to a new FAR 76—effectuating a move from the bad FAR to a new FAR.

Note that all three phases of the test pass may be repeated 77 in a multi-pass fashion using any number of different test conditions to fully test the memory. When all test passes are performed at all desired test conditions (e.g., high and low voltage, temperature, retention pause, etc.), the memory is finally determined to have passed 78 self-test and repair.

Referring again to FIG. 1, in each FAR a series of latches 12 are provided that can be accessed from an address bus 14. In addition to storing an address, each FAR includes latches for two additional status bits, a first bit that denotes or marks the FAR as "used" and a second bit that denotes or marks the FAR as "bad." Thus, if during BIST (first phase 50, FIG. 4), a FAR is utilized to store the address of a failing memory element, its "used" bit will be enabled. Moreover, if during BIST of the redundant memory elements (second phase 52, FIG. 4), a failing redundant memory element is found, the "bad" bit in its corresponding FAR is enabled. For the purposes of explanation, FAR 16 shows the logic for processing the "used" bit, and FAR 18 shows the logic for processing the "bad" bit. In an actual implementation, each FAR would include the logic for processing both status bits.

Compare circuitry 20 is provided for each FAR. When each of the element addresses are cycled (during the first or third phase), compare circuitry 20 may generate one of two signals if the stored address matches the address on the address bus 14. If the address on the address bus 14 matches and the FAR is used and not bad, then a USEDMATCH signal is generated by gate 24 (first phase 50, FIG. 4). This indicates that a failing element address is properly stored in working FAR, and no action needs to be taken. If the address matches and the FAR is bad, then a BADMATCH signal is generated by gate 26 (third phase 54, FIG. 4). This condition indicates that the address must be loaded from the address bus 14 into another unused FAR (if available).

During the first phase of BIST, the USEDMATCH signal is used to prevent storing failing addresses in multiple FARs. If a failing redundant element is detected during the second phase of BIST, the FAR is simply marked as bad. The failing address stays in the FAR. To copy the failing address to the next available FAR, the BIST engine must issue the failing address to the compare circuitry (i.e., phase 3). If the address is not stored in any good elements, then the FAR control logic generates a store signal. Subsequently, the new FAR compare circuitry generates a USEDMATCH signal, preventing multiple repairs of the same address.

Figure 2:
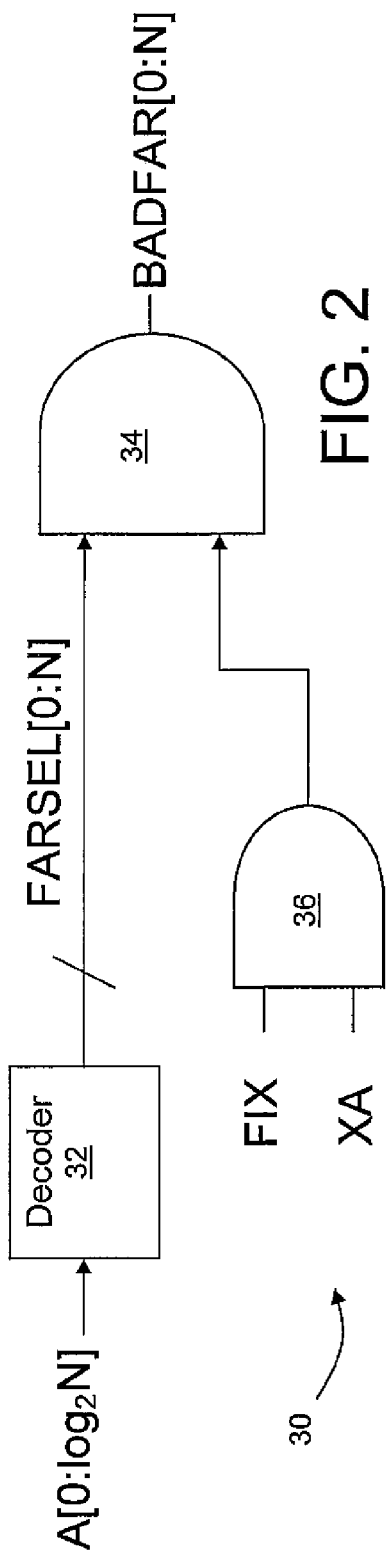
FIG. 2 depicts control logic for the FAR circuit of FIG. 1 in accordance with an embodiment of the present disclosure.

FIG. 2 depicts a logic diagram 30 for marking a FAR as bad, in which there are N FARs. When the extended address bit XA is enabled, decoder 32 decodes the subset A[0:log$_2$N] of the address A[0:M] being tested to a corresponding FAR select identifier (i.e., FARSEL[0:N]). If a FIX signal is generating, meaning that the corresponding redundant element failed, and XA is enabled, indicating that the address is an extended address for a redundant element, then gate 36 is enabled. In this case, the corresponding FAR (FARSEL[0:N]) is outputted as a bad FAR (i.e., BADFAR[0:N]) by gate 34.

Figure 3:
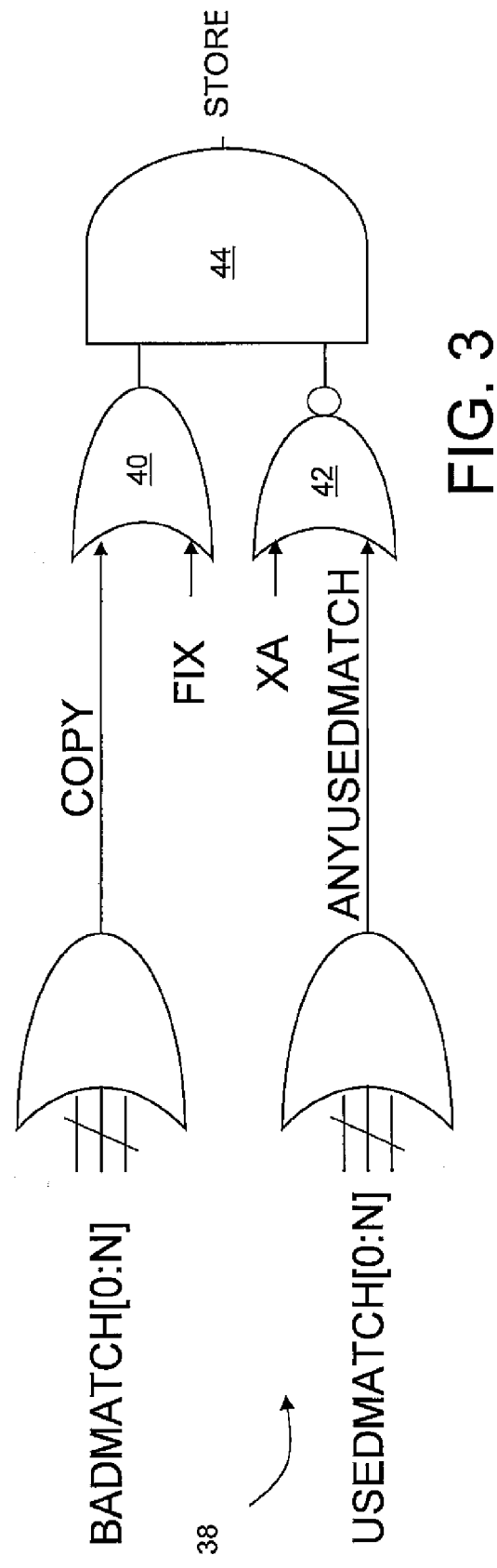
FIG. 3 depicts control logic for the FAR circuit of FIG. 1 in accordance with an embodiment of the present disclosure.

FIG. 3 depicts a logic diagram 38 for causing a failing address to be stored in a new FAR. The top half of the diagram 38 includes an OR gate 40 that is enabled any time there is a need for a new FAR. The bottom half of the diagram 38 includes a NOR gate 42 that ensures that the FAR is not for a redundant element or for a FAR that has already been allocated for the failing address.

As noted, a new FAR will be sought whenever a fix is required. Accordingly, during the first phase 50 (FIG. 4) of BIST, a FIX signal resulting from the detection of a failing memory element will enable OR gate 40. Moreover, during phase three cycling 54 (FIG. 4), when an address on the bus is indicated as matching an address of a corresponding bad FAR, i.e., BADMATCH[0:N], then a COPY signal is generated, which will also enable OR gate 40. However, the address will only be stored in a new FAR by AND gate 44 if NOR gate 42 is enabled. NOR gate 42 is enabled only if the address is not an extended address (XA) and there is no ANYUSEDMATCH signal. An ANYUSEDMATCH signal is generated anytime a USEDMATCH[0:N] occurs, meaning that the address is already stored in a working FAR.

Figure 5:
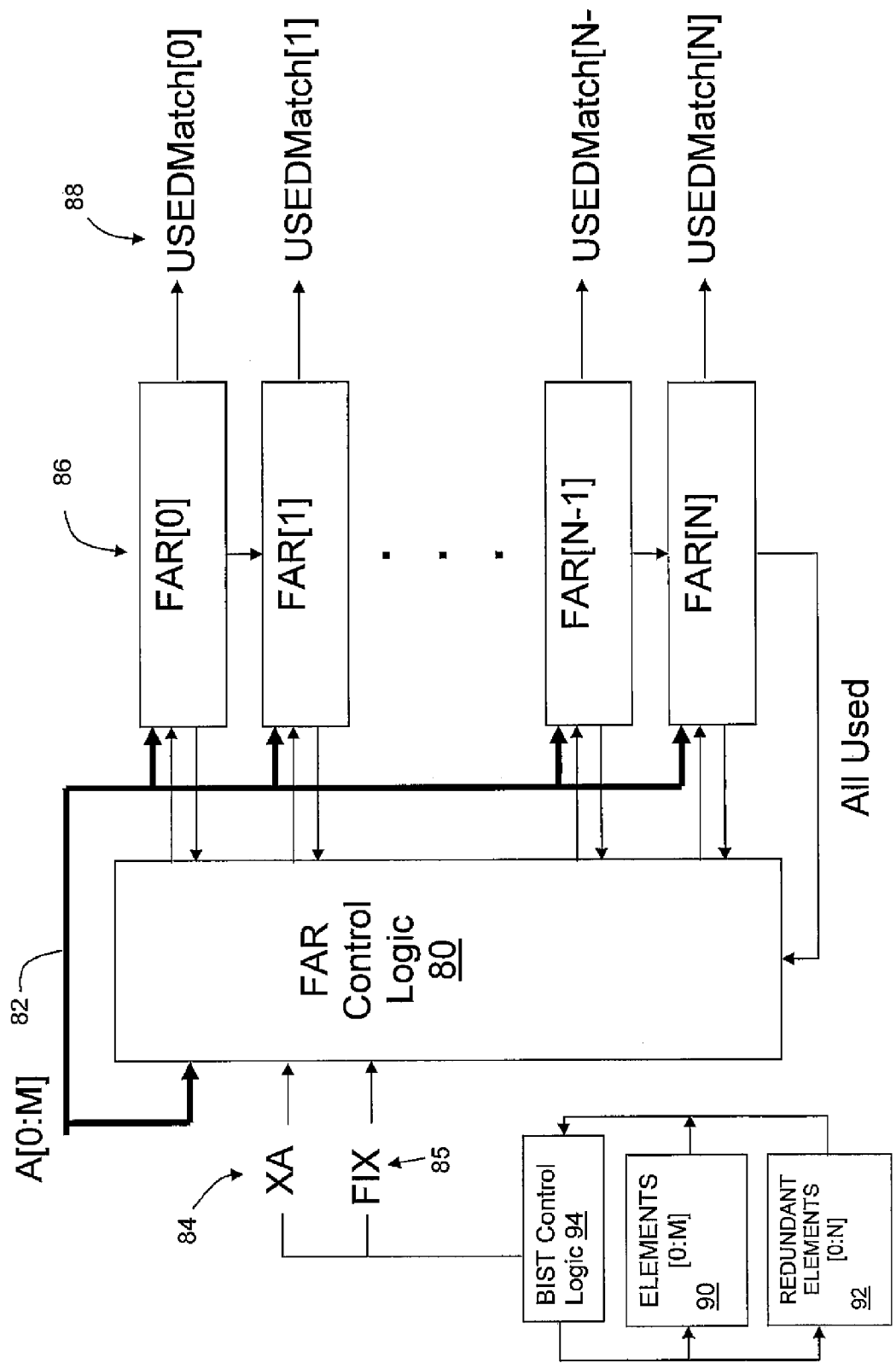
FIG. 5 depicts control logic for implementing FARs in accordance with an embodiment of the present disclosure.

FIG. 5 depicts a diagram showing illustrative control logic 80 for implementing FARs and BIST control logic 94 (also referred to herein as BIST system) for testing elements 90 and redundant elements 92. Control logic 80 receives as input an address A[0:M] from the address bus 82, an XA signal 84 if the address is for a redundant element, and a FIX signal 85 if a bad element is detected during BIST. During functional mode, compare circuits associated with each FAR 86 (item 10 of FIG. 1) compares the address in each FAR 86 with the address on the bus 82 (item 14 of FIG. 1). If the address matches, a USEDMATCH signal 88 is activated so that the address from the bus is mapped to an address of a redundant element stored in the FAR 86. In BIST mode, such as that shown in FIG. 2, the same compare circuitry associated with each FAR 86 is utilized to generate USEDMATCH signals 88 in a manner described above in the description of FIG. 1 (e.g., to generate a USEDMATCH or BADMATCH signal).

Figure 6:
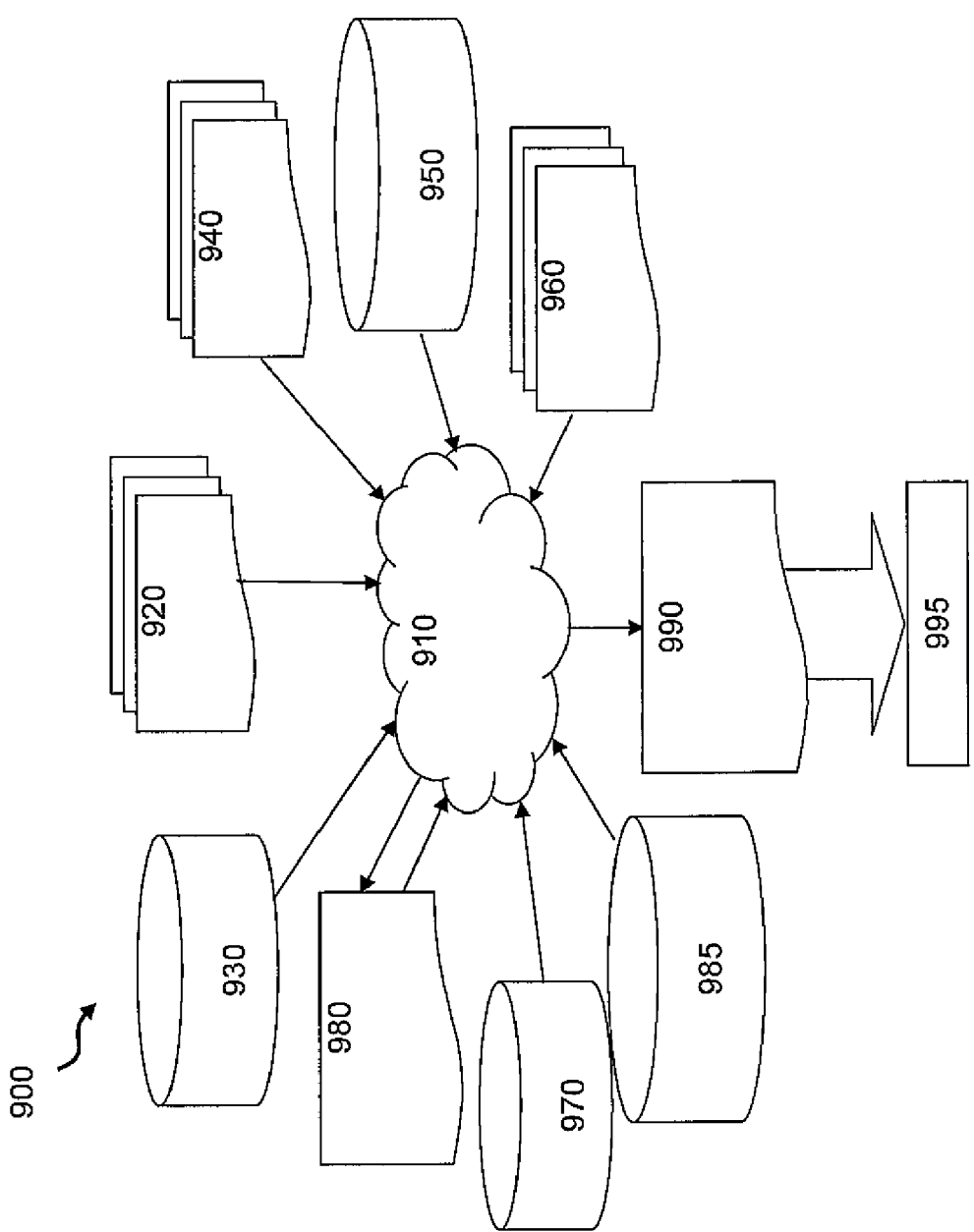
FIG. 6 shows a flow diagram of a design process used in semiconductor design, manufacture, and/or test.

FIG. 6 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1-3 and 5 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 1-3 and 5. Design process 910 preferably synthesizes (or translates) an embodiment of the invention as shown in FIGS. 1-3 and 5 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1-3 and 5, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-3 and 5. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. For example, it is understood that elements 90 and redundant elements 92 may comprise any type of element that is addressable on an integrated circuit, e.g., memory elements, display elements, etc. The following claims are in no way intended to limit the scope of the invention to the specific embodiments described herein.

What is claimed is:

1. A design structure embodied in a non-transitory machine readable medium for designing, manufacturing, or testing an integrated circuit, the design structure comprising:
   an integrated circuit having:
      a set of failing address registers (FARs) and an associated set of redundant memory elements,
      wherein each failing address register (FAR) in the set of FARs has a one-to-one correspondence with a redundant memory element in the associated set of redundant memory elements; and
      control logic for performing the following:
         testing a set of memory elements using a built in self test (BIST) system;
         placing an address of each failing memory element into a corresponding FAR in the set of FARs;
         marking each corresponding FAR as used when a single address of a failing memory element is placed into the corresponding FAR,
         wherein the marking of the corresponding FAR as used includes adjusting a first status bit in the corresponding FAR,
         wherein the failing address remains in the corresponding FAR until the failing address is issued to a set of compare circuitry;
         testing each redundant memory element using the BIST system;
         marking at least one FAR in the set of FARs as bad when a redundant memory element corresponding to the at least one FAR fails,
         wherein the marking of the at least one FAR as bad includes adjusting a second status bit in the FAR; and
         readdressing each of the memory elements in the set of memory elements by issuing the memory element addresses to the set of compare circuitry and using an address bus to place an address of a memory element in the set of memory elements being readdressed into a new FAR in the set of FARs when the address of the memory element being readdressed matches an address stored in a FAR in the set of FARs that has been marked as bad,
         wherein the readdressing includes reissuing the address of each of the memory elements.

2. The design structure of claim 1, wherein each FAR in the set of FARs includes latches for a set of status bits.

3. The design structure of claim 1, wherein the BIST includes multiple passes through the set of memory elements.

4. The design structure of claim 1, wherein the control logic for placing the address of each failing element into the FAR further compares the address of each failing element to addresses stored in FARs marked as used.

5. The design structure of claim 4, wherein the comparing of the address of each failing memory element to addresses stored in FARS marked as used utilizes compare circuitry that is also used by the integrated circuit in a functional mode.

6. The design structure of claim 5, wherein the compare circuitry is also used to determine if the memory element being readdressed matches an address in a FAR that has been marked as bad.

7. The design structure of claim 1, wherein the BIST includes a plurality of test passes through the set of memory elements, the plurality of test passes including a high voltage test pass and a low voltage test pass.

8. The design structure of claim 1, wherein the design structure comprises a netlist.

9. The design structure of claim 1, wherein the design structure resides on storage medium as a data format used for the exchange of layout data of integrated circuits.

10. The design structure of claim 1, wherein the design structure includes at least one of test data, characterization data, verification data, or design specifications.

11. A design structure embodied in a non-transitory machine readable medium for designing, manufacturing, or testing an integrated circuit, the design structure comprising:
    an integrated circuit, comprising:
       a built in self test (BIST) system for testing memory elements and redundant memory elements during a BIST mode;
       a set of failing address registers (FARs) for storing addresses of failing memory elements discovered during the BIST mode,
       wherein each failing address register (FAR) in the set of FARs has a one-to-one correspondence with a redundant memory element;
       an address bus connected to the set of FARs;
       compare circuitry for comparing addresses placed on the address bus during a functional mode with addresses stored in the set of FARs; and
       control logic which both marks a FAR as bad during the BIST mode in response to a corresponding redundant element failing, and utilizes the compare circuitry during the BIST mode to compare an address on the address bus during a readdress phase with addresses stored on each FAR that has been marked as bad,
       wherein the marking of the FAR as bad includes adjusting a status bit in the FAR.

12. The design structure of claim 11, wherein the control logic further utilizes the compare circuitry during a first test phase to compare a failing address associated with a failing memory element with each FAR in the set of FARs to determine if the failing address has already been stored in a FAR in the set of FARs.

13. The design structure of claim 11, wherein each FAR in the set of FARs includes latches for a set of status bits.

14. The design structure of claim 11, wherein the control logic causes the address on the address bus to be placed in a new FAR in the set of FARs during the readdress phase if the address matches an address in a FAR in the set of FARs marked as bad.

15. The design structure of claim 11, wherein the design structure comprises a netlist.

16. The design structure of claim 11, wherein the design structure resides on storage medium as a data format used for the exchange of layout data of integrated circuits.

17. The design structure of claim 11, wherein the design structure includes at least one of test data, characterization data, verification data, or design specifications.

18. A method of reallocating an address in a failing address register (FAR) of an integrated circuit when a corresponding redundant memory element fails performed on at least one computing device, the method comprising:
    providing a set of failing address registers (FARs) and an associated set of redundant memory elements,
    wherein each FAR in the set of FARs has a one-to-one correspondence with a redundant memory element in the set of redundant memory elements;

testing a set of memory elements and placing an address of each failing memory element into a FAR in the set of FARs using the at least one computing device, wherein the placing of the address includes marking the FAR as used by adjusting a first status bit in the FAR;

testing each redundant memory element in the set of redundant memory elements using the at least one computing device;

marking at least one FAR in the set of FARs as bad when a redundant memory element corresponding to the at least one FAR fails using the at least one computing device, wherein the marking of the at least one FAR as bad includes adjusting a second status bit in the at least one FAR; and readdressing each memory element in the set of memory elements by issuing the memory element addresses to a set of compare circuitry and using an address bus to place an address of a memory element being readdressed in a new FAR when the address of the memory element being re-addressed matches an address in a FAR that has been marked as bad.

* * * * *